(12) United States Patent
Wu et al.

(10) Patent No.: US 11,733,093 B2
(45) Date of Patent: Aug. 22, 2023

(54) SYSTEMS AND METHODS FOR DETECTION AND VISUALIZATION OF REFLECTION GLARES

(71) Applicant: Rivian IP Holdings, LLC, Plymouth, MI (US)

(72) Inventors: Shao-Hua Wu, Los Alamitos, CA (US); Chun Yeung, Cupertino, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 0 days.

(21) Appl. No.: 17/511,167

(22) Filed: Oct. 26, 2021

(65) Prior Publication Data

US 2023/0129320 A1 Apr. 27, 2023

(51) Int. Cl.

| | | |
|---|---|---|
| *G01J 1/44* | (2006.01) | |
| *H01L 27/146* | (2006.01) | |
| *B60R 1/08* | (2006.01) | |
| *H04N 25/50* | (2023.01) | |
| *G01J 1/42* | (2006.01) | |

(52) U.S. Cl.
CPC ............... *G01J 1/44* (2013.01); *B60R 1/088* (2013.01); *H01L 27/1462* (2013.01); *H04N 25/50* (2023.01); *G01J 2001/4266* (2013.01)

(58) Field of Classification Search
CPC .... G01J 1/44; G01J 2001/4266; H04N 25/50; B60R 1/088; H01L 27/1462
See application file for complete search history.

(56) References Cited

FOREIGN PATENT DOCUMENTS

GB       2527091 A    * 12/2015 ............... B60R 1/00

* cited by examiner

*Primary Examiner* — Kevin K Pyo
(74) *Attorney, Agent, or Firm* — Haley Guiliano LLP

(57) ABSTRACT

Systems and methods are provided to determine glare information. An optical filter is configured to attenuate visible light and pass near-infrared light and an image sensor is configured to detect light reflected by a surface after the reflected light passes through the optical filter. The image sensor is further configured to generate image data comprising a detected near-infrared portion of the light reflected by the surface. Processing circuitry is configured to receive the image data from the image sensor and determine near-infrared glare information based on the received image. The near-infrared glare information can be used to adjust display parameter associated with the surface or characterize near-infrared glare properties of the surface.

9 Claims, 14 Drawing Sheets

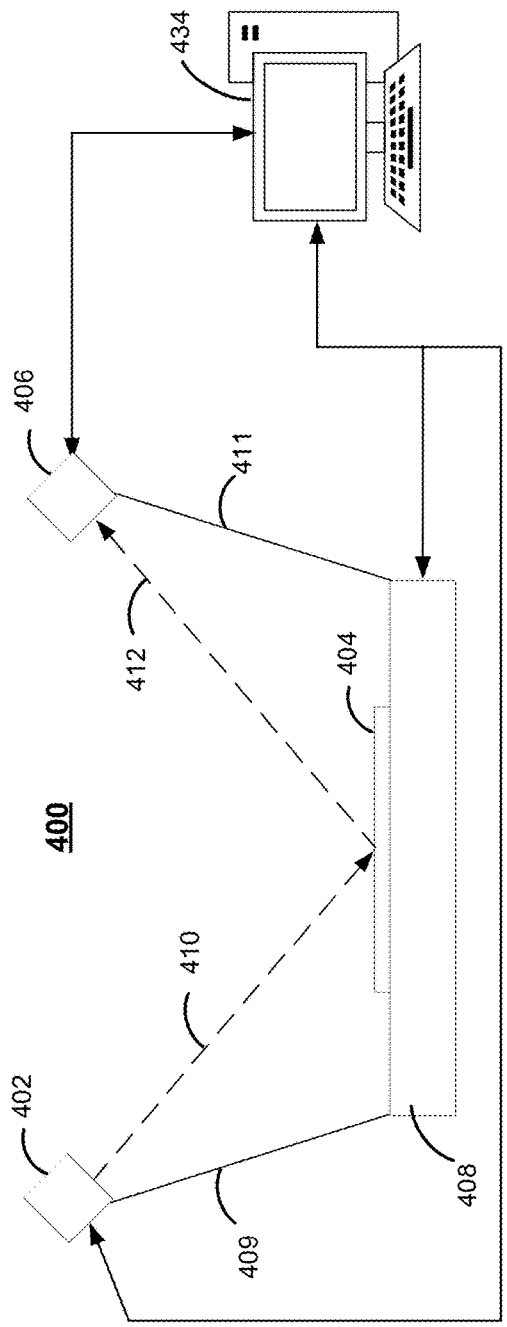
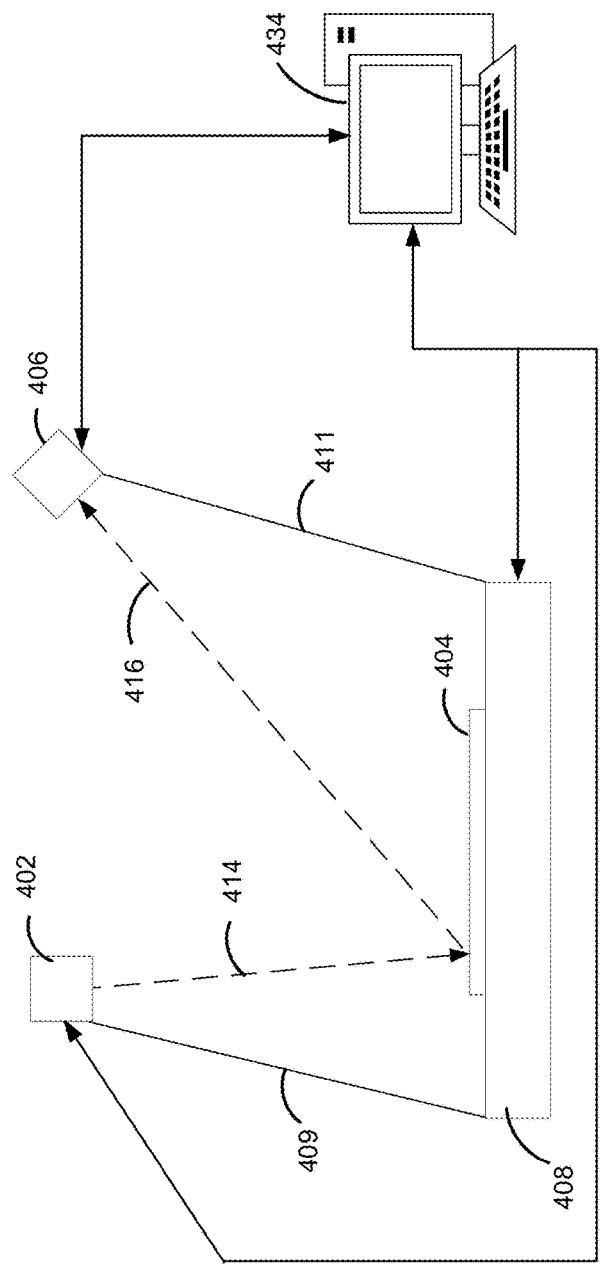
FIG. 4A
FIG. 4B

SYSTEMS AND METHODS FOR DETECTION AND VISUALIZATION OF REFLECTION GLARES

INTRODUCTION

Vehicles commonly incorporate active lighting components, such as LEDs or OLEDs, to convey information to occupants of the vehicle, e.g., via a dashboard display. Light is emitted by the lighting components in the visible light spectrum to enable the vehicle occupants to perceive the information. However, sunlight comprising light in the ultraviolet, infrared and visible spectrum that enters the vehicle during daytime drives reflects off interior vehicle surfaces. Such reflections of visible light can cause vehicle occupants to be subjected to glare when observing the display, which makes it difficult for vehicle occupants to perceive information (e.g., GPS directions, media information) provided by the lighting components in the visible light spectrum. There is a need to enable the impact of reflection glare to be quantitatively assessed, and there is also a need for a technique to better counteract reflection glare while a vehicle is being operated.

SUMMARY

In accordance with the present disclosure, systems and methods are provided that employ an image sensor to detect, and generate image data based on, a near-infrared portion of light reflected by a surface, and determine near-infrared glare information based on the image data. Such systems and methods may employ an optical filter configured to attenuate visible light and pass near-infrared light, and an image sensor configured to detect light reflected by a surface after the reflected light passes through the optical filter and generate image data comprising a detected near-infrared portion of the light reflected by the surface. Processing circuitry may be configured to receive the image data from the image sensor, and determine near-infrared glare information based on the received image data.

In addition, systems and methods for counteracting glare in a vehicle may be provided to receive image data, which comprises a portion of light reflected by an interior surface of a vehicle, from an image sensor in the vehicle. Glare information may be determined based on the received image data, and a determination of whether glare is present on a display of the vehicle may be made based on the glare information. In response to determining that glare is present, a parameter associated with the display to counteract the glare may be adjusted. In some embodiments, the portion of light is a near-infrared portion of light, and the glare information is near-infrared glare information.

In addition, the provided systems and methods may cause a light source to irradiate a surface with light from a plurality of angles, where the light comprises a near-infrared portion, and image data generated based on detecting the near-infrared portion of light reflected by the surface in response to irradiating the surface with the light from the plurality of angles may be received from an image sensor. For each of the plurality of angles, the image data may be processed to determine an amount of near-infrared glare to characterize near-infrared glare properties of the surface, and the near-infrared glare properties of the surface may be output.

In some embodiments, the surface may comprise an interior display of a vehicle.

In some embodiments, the image data comprises a plurality of pixels, and the processing circuitry is configured to determine near-infrared glare information (e.g., to be used in determining whether glare is present on the display of the vehicle), or determine an amount of near-infrared glare to characterize near-infrared glare properties of the surface, based on the received image data by: determining, for each pixel of the plurality of pixels, respective intensity values; and identifying one or more pixels of the plurality of pixels having an intensity value that exceeds a predetermined threshold intensity value.

In some embodiments, the image data comprises a plurality of pixels, and the processing circuitry is configured to determine near-infrared glare information (e.g., to be used in determining whether glare is present on the display of the vehicle), or determine an amount of near-infrared glare to characterize near-infrared glare properties of the surface, based on the received image data by: determining, for each pixel of the plurality of pixels, respective intensity values; and identifying multiple pixels of the plurality of pixels having an intensity value that exceeds a predetermined threshold intensity value.

In some embodiments, the image data comprises a plurality of pixels, and the processing circuitry is configured to determine near-infrared glare information (e.g., to be used in determining whether glare is present on the display of the vehicle), or determine an amount of near-infrared glare to characterize near-infrared glare properties of the surface, based on the received image data by: determining, for each pixel of the plurality of pixels, respective intensity values; identifying multiple pixels of the plurality of pixels having an intensity value that exceeds a predetermined threshold intensity value; and determining glare is present at multiple regions of the image data, wherein each of the multiple regions comprises a separate grouping of a subset of the identified multiple pixels.

In some embodiments, the parameter associated with the display of the vehicle that is adjusted in response to determining that glare is present comprises at least one of a contrast ratio or brightness.

In some embodiments, the systems and methods may determine, based on input received from one or more position sensors, that a change in an orientation of the vehicle is occurring or is about to occur. Based on the determined change in the orientation and based on the near-infrared glare information, a prediction may be generated of a location on the display where glare is likely to be present in response to the change in the orientation of the vehicle. The adjusting of the parameter associated with the display of the vehicle may be performed based on this prediction.

In some embodiments, the image sensor is disposed at a location that corresponds to an approximate height of the operator of the vehicle and that is in a vicinity of a head rest location of an operator seat of the vehicle.

In some embodiments, determining whether glare is present on the display of the vehicle based on the near-infrared glare information comprises determining glare is present at a region of image data that corresponds to the display, and adjusting the parameter associated with the display to counteract the glare comprises adjusting a parameter in a portion of the display that corresponds to the region of the image data where glare is present and not adjusting the parameter in a different portion of the display.

In some embodiments, determining glare is present at the region of image data that corresponds to the display comprises determining, for each pixel of the plurality of pixels, respective intensity values and identifying multiple pixels of the plurality of pixels having an intensity value that exceeds a predetermined threshold intensity value. In some embodiments, determining glare is present at the region of image data that corresponds to the display comprises determining glare is present at multiple regions of the image data, where each of the multiple regions comprises a separate grouping of a subset of the identified multiple pixels, at least one of the regions corresponding to the display and at least one of the regions corresponding to an additional display, and adjusting the parameter associated with the display to counteract the glare further comprises adjusting a parameter in a portion of the additional display that corresponds to the region of the image data where glare is present and not adjusting the parameter in a different portion of the additional display In some embodiments, causing the light source to irradiate the surface with light from the plurality of angles comprises moving the light source to a plurality of positions respectively corresponding to the plurality of angles. In some embodiments, an amount of scattering, or a distribution of scattering, associated with the reflected light, is determined. In some embodiments, processing the image data to determine an amount of near-infrared glare comprises determining a size of a region of the image data that comprises multiple pixels having an intensity that exceeds a predetermined threshold intensity value. In some embodiments, causing the light source to irradiate the surface with light from the plurality of angles comprises moving the surface to a plurality of positions respectively corresponding to the plurality of angles, wherein the light source remains stationary when irradiating the surface with light from the plurality of angles.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and should not be considered limiting of the breadth, scope, or applicability of these concepts. It should be noted that for clarity and ease of illustration, these drawings are not necessarily made to scale.

FIGS. 4A-4B show block diagrams of components of a system for characterizing near-infrared glare properties of a surface, in accordance with some embodiments of the present disclosure;

DETAILED DESCRIPTION

Figure 1:
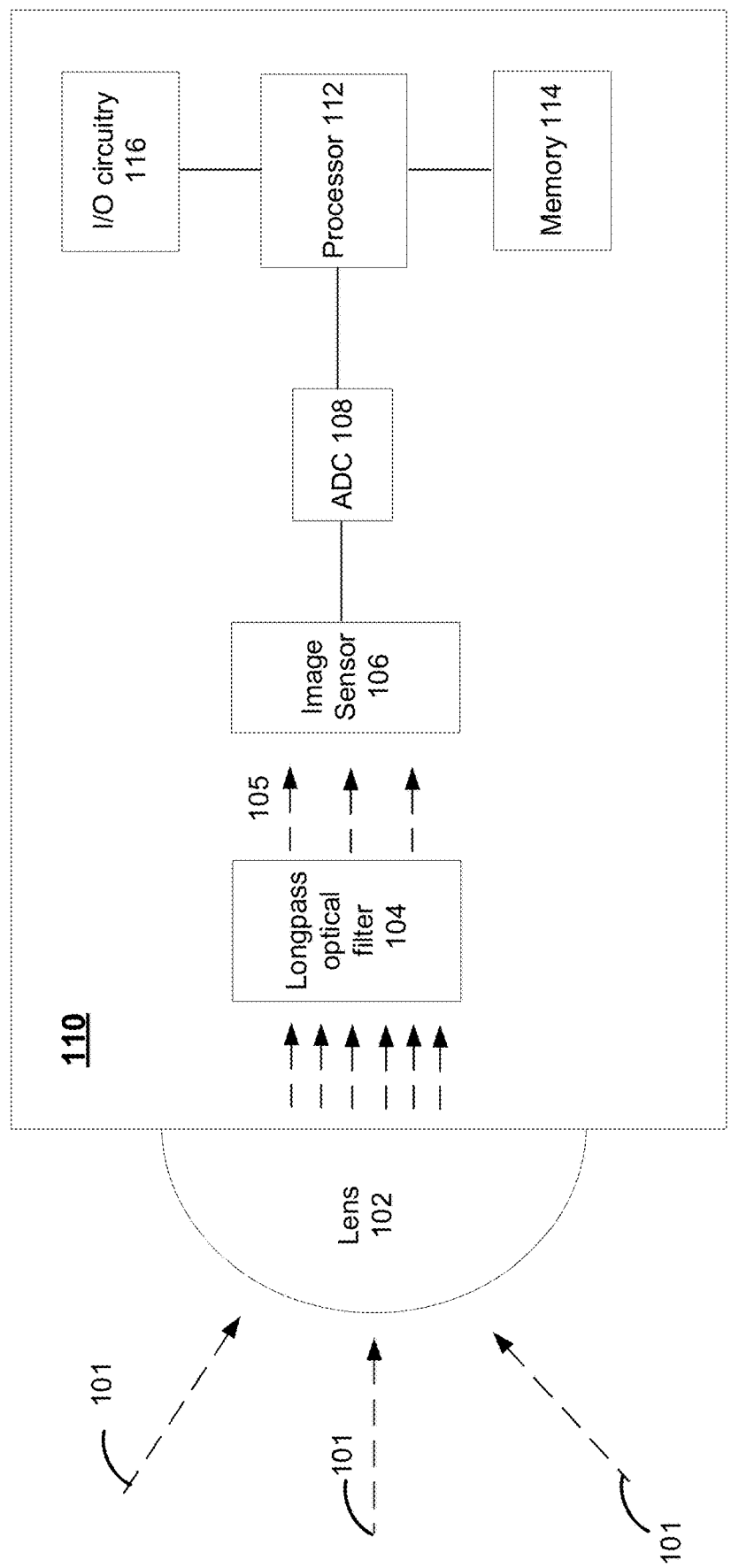
FIG. 1 shows a block diagram of a digital camera, in accordance with some embodiments of the present disclosure.

The present disclosure is directed to improved techniques for the detection and visualization of reflection glares, and more particularly to employing an image sensor to detect, and generate image data based on, a near-infrared portion of light reflected by a surface, in order to determine near-infrared glare information based on the image data and/or adjust a parameter associated with a display of a vehicle (in which the image sensor may be located) to counteract the glare. For example, the systems and methods described herein may be implemented using digital camera 110 depicted in FIG. 1.

Digital camera 110 is configured to receive light 101 from its surrounding environment through lens 102, which may be configured to focus the received light 101 towards image sensor 106. Light 101 may then pass through longpass optical filter 104 configured to highly attenuate a portion of light 101 in the visible light spectrum, and pass with low attenuation a portion 105 of light 101 that is in the near infrared (NIR) range of wavelengths. As referred to herein, the visible light spectrum should be understood as the range of wavelengths of the electromagnetic spectrum that can be detected by the human eye (about 380 nm to 760 nm), and the NIR region should be understood as the range of wavelengths of the electromagnetic spectrum from about 750 to 2500 nm.

In some embodiments, longpass optical filter 104 may comprise an absorptive or dichroic filter having one or more layers of glass, plastic, substrates, dielectric materials, epoxy and/or metals. In some embodiments, longpass optical filter 104 may be a bandpass filter that passes NIR light and attenuates long-wave infrared light and visible light. In some embodiments, longpass optical filter 104 may be a color filter or gel filter. In some approaches, cameras have employed one or more of a longpass blue optical filter and a shortpass infrared optical filter, respectively used to attenuate ultraviolet and infrared light (e.g., so that only wavelengths in a range of 380 nm-740 nm are detected). In some embodiments, such longpass blue optical filter and shortpass infrared optical filter may be intentionally omitted or removed from camera 110, to facilitate detection of light within the NIR range (e.g., such as in a range of 800-1100 nm).

Image sensor 106 detects NIR light 105 passed or transmitted through filter 104, and generates image data based on the detected NIR light by converting NIR light 105 comprising photons into electrical signals. In some embodiments, image sensor 106 may be a charge-coupled device (CCD) comprising an array of light-sensitive pixels or capacitors storing charge corresponding to an intensity of light received by each pixel, where such pixels may act as a photodiode to convert photons of specific wavelengths to photocurrent. Semiconductor bandgap materials such as silicon, capable of detecting photons having wavelengths up to 1200 nm, and germanium, e.g., InGaAs-based CCD or CMOS capable of detecting photons having wavelengths of 900 nm-2600 nm, may be utilized in fabricating the CCD. In some embodiments, image sensor 106 may be complementary metal oxide semiconductor (CMOS) sensors where each pixel comprises a CMOS transistor. The image data generated by image sensor 106 may be an analog output and digitized at analog-to-digital converter (ADC) 108 for processing at processor 112. In some embodiments, processor 112 may comprise ADC 108 to digitize the image data generated by image sensor 106.

Processor 112 may comprise a hardware processor, a software processor (e.g., a processor emulated using a virtual machine), or any combination thereof, and may be configured to perform image processing on the image data generated by image sensor 106. For example, processor 112 may cause the image data generated by image sensor 106 to be stored in memory 114, and processor 112 may analyze or operate on a plurality of pixels of the image data to determine whether glare is presented based on glare information. For example, processor 100 may identify one or more pixels or groups of pixels having an intensity value above a predetermined threshold, and determine whether glare is present based on near-infrared glare information or properties, as discussed in further detail below. In some embodiments, a distribution of glare in the image data may be determined by processor 112 (or another computing device in communication with camera 110). Processor 112 may store the image data or processed image data at memory 114, and/or transmit the image data or processed image data via input/output (I/O) circuitry 116 (e.g., wirelessly or via a wired connection) to another computing device. As referred to herein, glare should be understood as an amount of brightness concentrated on an object that impairs the ability of a person to visually observe an object. Moreover, attempting to view an object associated with the glare may cause the person discomfort or irritation.

Figure 2:
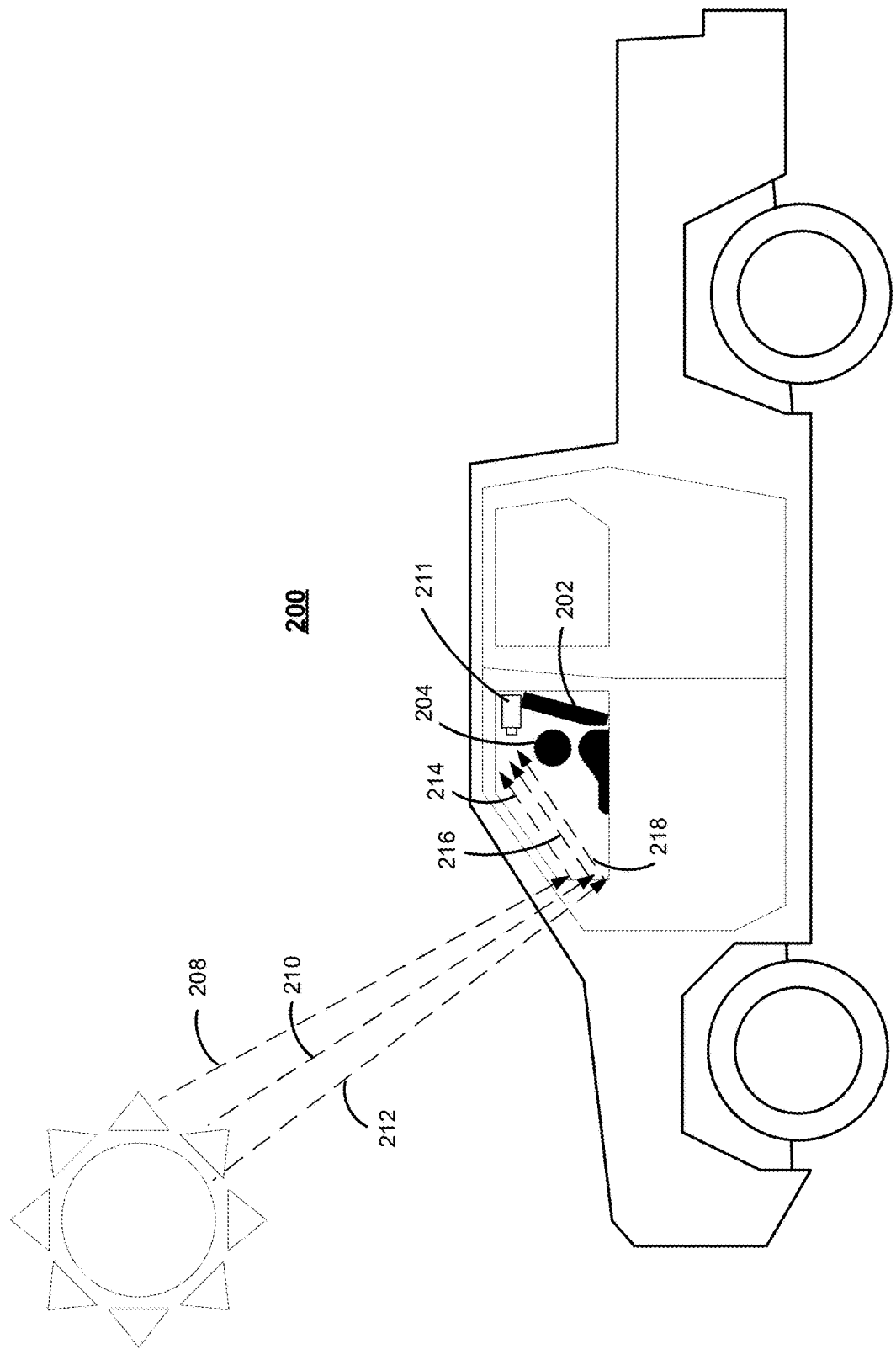
FIG. 2 shows a block diagram of an exemplary vehicle in which an image sensor may be configured to generate image data for use in determining near-infrared glare information, in accordance with some embodiments of the present disclosure.

FIG. 2 shows a block diagram of an exemplary vehicle 200 in which image sensor 106 of FIG. 1 may be configured to generate image data for use in determining near-infrared glare information, in accordance with some embodiments of the present disclosure. Any number of digital cameras 211, which may correspond to digital camera 110 comprising image sensor 106 of FIG. 1, may be disposed at suitable locations within or external to vehicle 200 to detect reflections of light from a light source (e.g., the sun, depicted in the top left portion of FIG. 2) while driver 204 is operating vehicle 200. For example, light 208, 210, 212 from the sun may strike an exterior or interior surface of vehicle 200, and be reflected as light 214, 216, 218, respectively. FIG. 2 shows sunlight entering through a front windshield of vehicle 200, although it should be appreciated that sunlight can be received from any direction, for example, when vehicle 200 is on the move. In some embodiments, image sensor 106 may additionally or alternatively be positioned at, or in predefined vicinity of, a passenger seat. In some embodiments, a sensor (e.g., a lux meter) may be employed to measure illuminance at particular portions of display 306.

Camera 211 may be disposed at a location that is in a vicinity of a head rest location of operator seat 202 of vehicle 200 (e.g., in or around the head rest of operator seat 202), in order to detect one or more of light 214, 216, 218 reflected off exterior or interior surfaces of vehicle 200. In some embodiments, two or more cameras may be disposed at locations in a vehicle (e.g., on both sides of a head rest or in head rest and at a center position of a ceiling of vehicle 200), and images from each of the cameras may be considered in combination (e.g., an image may be interpolated based on input images from each of the cameras) to determine glare being experienced by operator 204 (e.g., since cameras 211 may be offset from a view of operator 204) and/or a passenger seated at the passenger seat of vehicle 200. In some embodiments, portions of light 214, 216, 218 reflected off exterior or interior portions of vehicle 200 may be specular in nature such that light is reflected at the same angle as an incoming angle of light 208, 210, 212, or diffuse in nature such that light is reflected at a different angle than the incoming angles of each of light 208, 210, 212. Camera 211 may comprise processor 112 of FIG. 1, and processor 112 may receive image data from image sensor 106 based on detected reflected light 214, 216, 218 (having been filtered by longpass filter 104 to attenuate visible light) and analyze this image data to determine near-infrared glare information. Based on such near-infrared glare information, processor 112 may determine whether glare is present. In some embodiments, the near-infrared glare information may include an indication of a distribution of glare.

In some embodiments, multiple image sensors 106 may be suitably arranged, e.g., spaced apart in a row across a ceiling of vehicle 200, to detect reflections as light passes across display 306, such as when vehicle 200 is on the move. For example, image sensors 106 may detect reflected light indicative of glare shifting across display 306, and perform corrective action (e.g., adjust a parameter of a portion of display 306 to counteract current glare, and adjust a parameter of another portion of display 306 to counteract anticipated glare at that portion based on the detected pattern of the shifting glare).

Figure 3:
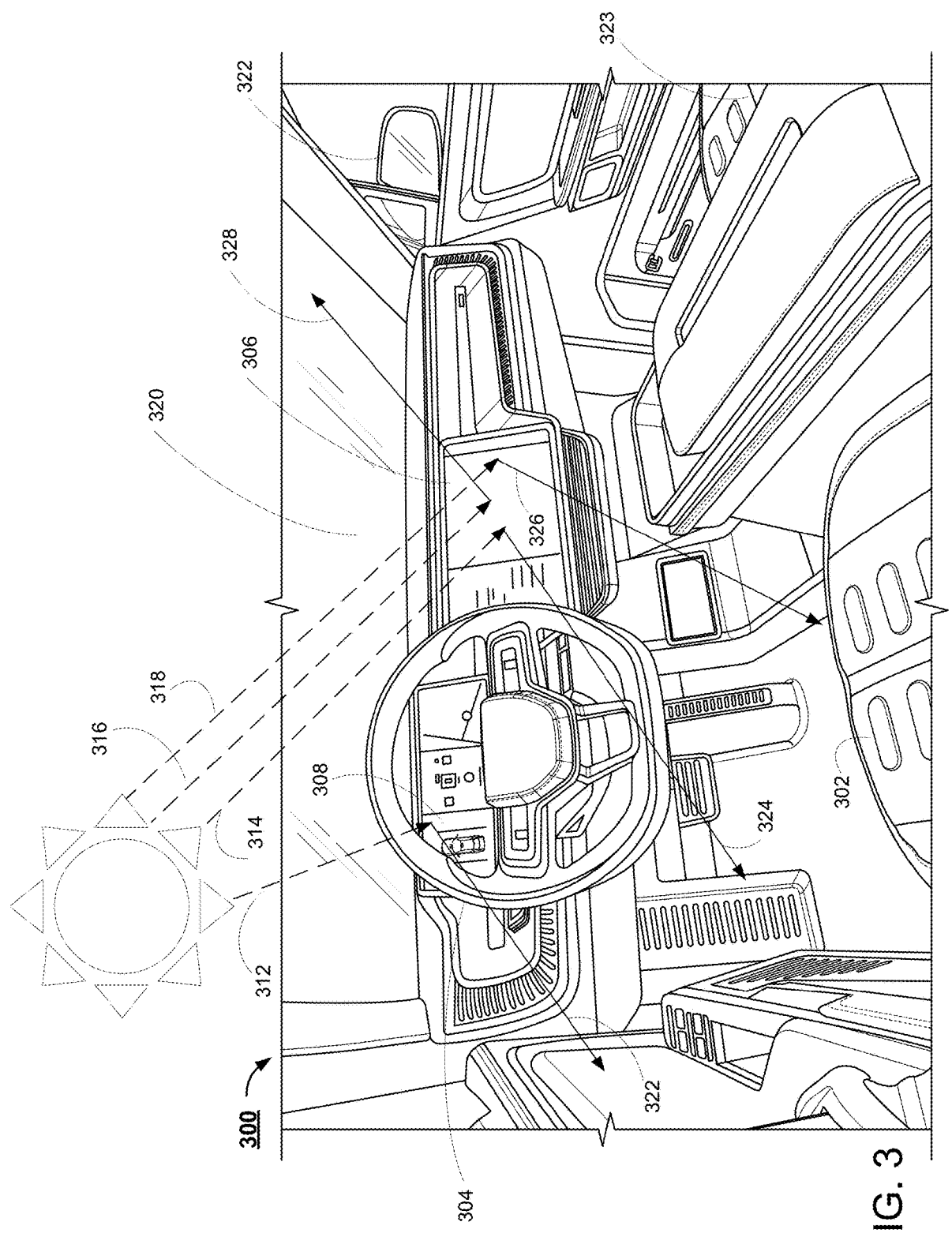
FIG. 3 shows an exemplary interior of a vehicle in which an image sensor may be configured to generate image data for use in determining near-infrared glare information, in accordance with some embodiments of the present disclosure.

FIG. 3 shows an exemplary interior 300 of vehicle 200 in which image sensor 106 may be configured to generate image data for use in determining near-infrared glare information, in accordance with some embodiments of the present disclosure. Vehicle interior or vehicle cabin 300 may comprise driver seat 302, steering wheel 304, and one or more dashboard displays 306 and/or 308. Vehicle 200 may further include windshield 320 disposed in front of driver's seat 302, a right side rear view mirror 322, a left side rear view mirror (not shown) and a rear view mirror (not shown). In some embodiments, one or more of dashboard displays 306 and/or 308 and/or a heads-up display at windshield 320 may display various information to a user (e.g., GPS information, current speed information, media information, vehicle settings, time and weather information, etc.) As discussed, any number of digital cameras 211 comprising image sensors 106 may be positioned at suitable locations within vehicle 200 to detect reflections of light from a light source (e.g., the sun depicted in FIG. 3). For example, light from the sun may be reflected in a specular or diffuse manner off the exterior or interior 300 of vehicle 200, and detected by one or more image sensors 106 (e.g., positioned at driver seat 302 and/or passenger seat 323).

In the example of FIG. 3, light 312, 314, 316, 318 may strike display 306 or 308 and reflect at various angles as reflected light 324, 326, 328, respectively. It should be appreciated that light from the light source may strike any portion of vehicle 200 or interior 300 of vehicle 200 (e.g., steering wheel 304, right side mirror 322, left side rear view mirror, rear view mirror, windshield 320, driver seat 302, passenger seat 323, steering wheel 304, etc.), and reflected light of the light from the light source may propagate in any direction (e.g., towards any of the components of vehicle 200). In some embodiments, digital camera 211 may be positioned at a height or eye level of the driver of vehicle 200 sitting in driver's seat 302 (and/or a passenger seated in passenger seat 323), and detect reflected light, in order to determine near-infrared glare information while vehicle 200 is in operation. Based on such near-infrared glare information, processor 112 (and/or another computing device) may determine whether glare is present. In some embodiments, multiple cameras 211 may be in communication with each other to aggregate image data from the detected reflected light over time.

In determining near-infrared glare information, processor 112 of camera 110 (and/or another computing device) may analyze image data received from image sensor 106 corresponding to the reflected light in the NIR range to identify a region of the image data having groups of pixels with an intensity value of NIR light that is greater than a predetermined value as a region associated with glare that may impair the visibility of the display to driver 204 of vehicle 200. For example, pixel intensity values may correspond to a brightness of the pixel received from image sensor 106 (e.g., if a pixel value is represented by 8 bits, a pixel value has possible values of 0 to 255, where a value of 255 corresponds to white and a value of 0 corresponds to black). It should be appreciated that any suitable number of bits per pixel may be utilized (e.g., 8 bits per pixel, 10 bits per pixel, 24 bits per pixel, etc.). The image data may be in grayscale where each pixel corresponds to a single intensity, or color where each pixel has red, green and blue (RGB) values. In some embodiments, a distribution of glare in the reflected light may be taken into account by processor 112 (or another computing device in communication with camera 110) in determining regions of captured image data associated with glare. In some embodiments, a region of image data may be understood as predefined number of pixels adjacent to or otherwise in a vicinity of each other in subset of the image data. In some embodiments, successive images captured within a predetermined period of time, comprising image data from one or more image sensors 106, may be analyzed to determine near-infrared glare information.

In some embodiments, in response to determining that glare is present at a particular region of the image data received from image sensor 106, processor 112 may adjust a parameter associated with one or more of display 306, 308 to counteract (e.g., eliminate or reduce impact of) the glare while vehicle 200 is in operation. For example, the parameter to be adjusted may comprise a contrast ratio or brightness of display 306, which may be increased to compensate for the detected glare and increase the visibility of display 306. Such parameter(s) may be increased or decreased at portions of display 306 identified as corresponding to regions of the image data depicting such portions of display 306 and indicated as being associated with glare information. In some embodiments, parameters of portions of display 306 determined not to be subject to glare need not be modified. In other words, portions of display 306 may be selectively modified to target locations where glare is determined to be present. In some embodiments, the parameter may correspond to color mapping, e.g., altering the display to black and white coloring, or altering a color of a particular portion of display 306 to enable such portion to be more visible in the presence of glare. In some embodiments, a sensor (e.g., a lux meter) may be employed to measure illuminance at particular portions of display 306.

Image processing (e.g., edge detection, object recognition, computer vision techniques) may be performed on the image data received from image sensor 106 to identify which region of the image data depicts display 306, and which portions of display 306 should be adjusted to compensate for glare (and which portions may not need to be adjusted). For example, pixel distance within the image data (i.e., the number of pixels between two pixels within the image data) may be mapped to a location of display 306 based on known dimensions or locations of objects within the image data. For example, the system may store a length of display 306, a distance from camera 211 to display 306, and use these relationships to correlate pixel distance to real world distance. In some embodiments, multiple cameras 211 at different locations may be employed in a stereo vision process, where each camera outputs image data comprising a depiction of display 306 and/or display 308, and a projection matrix of each camera 211 in the stereo vision process may be used to map a pixel location in the image data to a location in display 306. In some embodiments, camera 110 may be configured to focus image sensor 106 on components of vehicle likely to be susceptible to glare, e.g., display 306. For example, image data may correspond to a zoomed-in depiction of display 306 and/or display 308, and/or regions of image data.

FIGS. 4A-4B show block diagrams of components of a system 400 for characterizing near-infrared glare properties of surface 404, in accordance with some embodiments of the present disclosure. System 400 may be configured such that light source 402 irradiates surface 404 with light from a plurality of angles, and camera 406 (e.g., which may correspond to digital camera 110 of FIG. 1 and digital camera 211 of FIG. 2) may be configured to capture images of light reflected off surface 404 having been emitted from light source 402. In some embodiments, light source 402 may be stationary (e.g., at a fixed position, and/or may correspond to the sun) and surface 404 may be configured to move (e.g., as vehicle 200 moves, and vehicle 200 may comprise surface 404). In some embodiments, system 400 may be used to determine glare properties of all light reflected by surface 404 (e.g., visible light and NIR light).

For example, as shown in FIG. 4A, light source 402 may emit light from angle 410, and the light may reflect off surface 404 as specular reflection 412 such that the light reflects off surface 404 at the same respective angles 410 that the light was emitted from light source 402. In addition, as shown in FIG. 4B, light source 402 may emit light from angle 414 that differs from angle 410, and reflected light 416 may be diffuse in nature such that light can be reflected at a different angle 416 than incoming angle 414 at which the light is emitted from light source 402 towards surface 404. While FIGS. 4A-4B show light emitted from light source 402 at two different angles, it should be appreciated that light may be emitted towards surface 404 from any suitable number of angles and from any suitable location (and reflected light may be received by camera 406 positioned at any suitable location).

Light source 402 may be any source of light configured to emit NIR light, e.g., sunlight, incandescent lights, certain LEDs, lasers, laser diodes, etc. In some embodiments, surface 404 may be placed on platform 408, where light source 402 may be coupled to platform 408 by way of arm 409, and camera 406 may be coupled to platform 408 by way of arm 411. Platform 408 may be in communication with computer 434 (e.g., via a wired or wireless connection) to receive control signals instructing movement and/or rotation of a mechanism (e.g., arms 409 and/or 411) to cause light source 402 and/or camera 406 to be moved relative to surface 404 when emitting light from a plurality of angles towards surface 404. In some embodiments, platform 408 may comprise a motor coupled to arms 409 to cause translation and/or rotation of light source 402 and/or camera 406. In some embodiments, a manually operative mechanism alternatively may be utilized to vary the location of light source 402 and camera 406, such that light source 402 may be elevated, lowered, or moved transversely in order to emit light from different angles towards surface 404, and/or may be configured to rotate about its axis to emit light from different angles towards surface 404. In some embodiments, camera 406 may be placed on a corresponding platform and/or manually operated to capture light reflecting off surface 404 from multiple angles, and the location of camera 406 may be varied (e.g., based on control signals from computer 434) to enable camera 406 to capture light 412, 416 reflecting off surface 404.

In some embodiments, computer 434 may correspond to one or more computing device that is onboard vehicle 200 and/or one or more remote servers configured to provide cloud computing resources. For example, surface 404 may be positioned in or form a part of vehicle 200, and while vehicle 200 is being moved, light source 402 (which may in some embodiments comprise a stationary light source such as the sun) may irradiate surface 404. Based on light reflected by surface 404, camera 406 (alone or in combination with computer 434) may determine whether glare is present. In some embodiments, computer 434 (or other computing equipment in communication with computer 434) may be configured to store one or more light characteristics (e.g., position, angle, intensity) of the light received from the sun and reflected by vehicle 200 based on, e.g., positioning data, accelerometers, time of day, weather, etc. In some embodiments, such data may be gathered during test drives or other traveling by vehicle 200, e.g., data may be gathered continuously as users drive around. For example, computer 434 may predict a location of glare at least in part by identifying, based on the stored data, a position of the sun during a current time of day, as discussed in further detail below.

Surface 404 may be any surface that a user desires to characterize near-infrared glare information of. For example, surface 404 may correspond to a display surface of vehicle 200 (e.g., a dashboard display 306, 308 or a head-up display at windshield 320). Camera 406, alone or in combination with another computing device 434 (e.g., which camera 406 may communicate with wirelessly or by wire via I/O circuitry 116 of FIG. 1, and with light source 402 and/or platform 408 may be in communication with), may determine near-infrared glare information based on light (e.g., 416, 418, 420, 428, 430, 432) reflected off surface 404.

Such near-infrared glare information may indicate how much reflected light results in glare as a function of an angle of surface 404 with respect to light source 402, and over a range of angles, how reflected light is dispersed or distributed and how that relates to glare, and different patterns of the reflected light when light source 402 is placed at certain angles relative to surface 404.

In some embodiments, system 400 of FIGS. 4A-4B may be employed in the design phase of vehicles (e.g., vehicle 200). For example, when selecting a suitable material or surface to be used as a component (e.g., steering wheel 304, display 306, display 308, windshield 320) in the construction of vehicle 200, candidate materials (e.g., coatings for windshield 320, glass for windshield 320, driver window, passenger windows, etc.) or surfaces of such components may be used as surface 404, to determine near-infrared glare properties based on analysis by camera 406 and/or another computing device of the image data at various angles. In addition, an optimal angle and orientation of surface 404 within vehicle 200 may be identified to minimize glare. In this way, components with optimal glare properties may be selected during the vehicle design process. In addition to providing tools to analyze the image data, such aspects may enable those involved in the vehicle design process to visually observe the images output by camera 406 (e.g., at computer 434) to identify the severity of reflection glares with varying sun lighting conditions (e.g., at various amplitudes and various incident angles), thereby allowing for quantitative and qualitative study of glare information.

Figure 5:
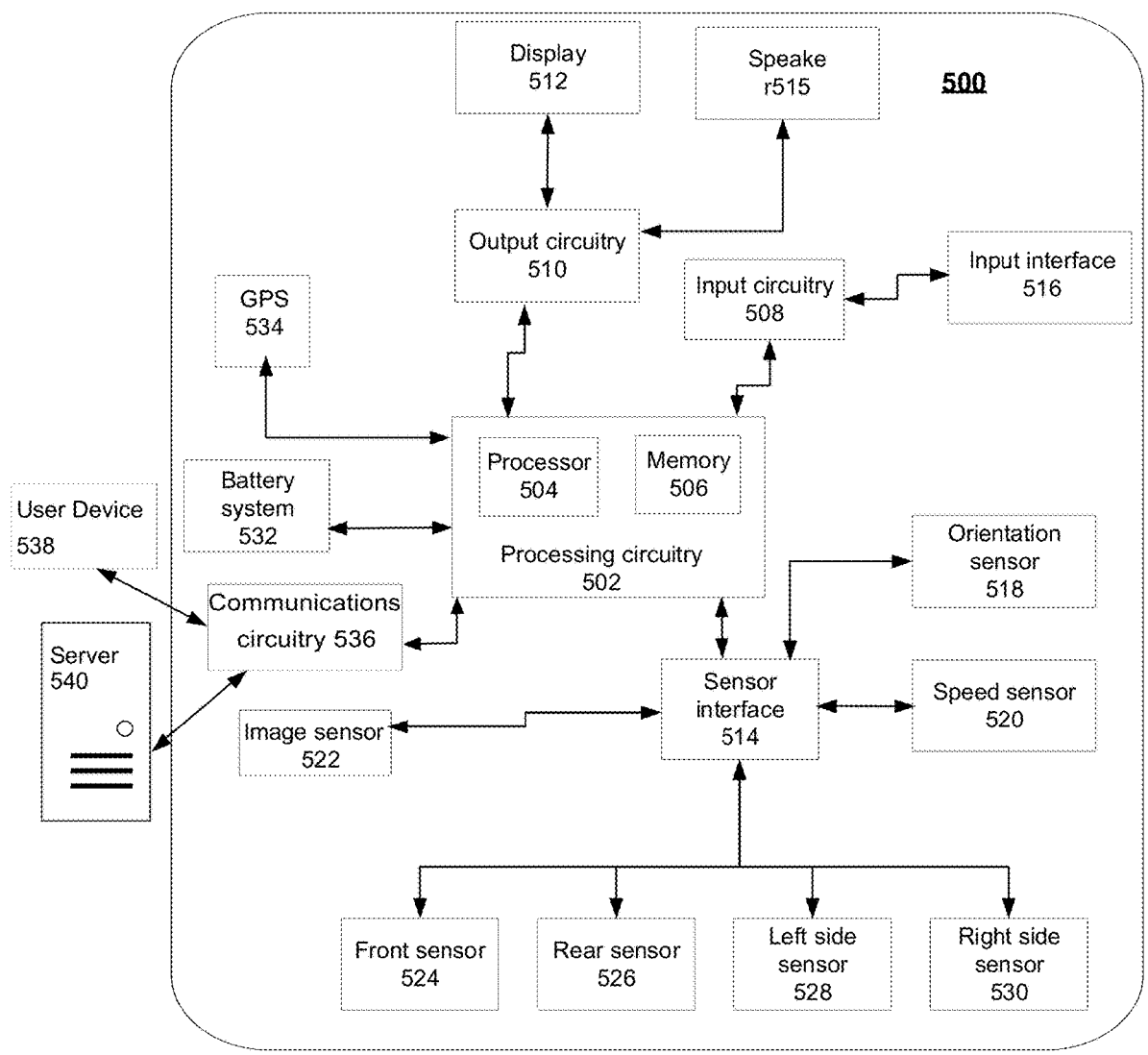
FIG. 5 shows a block diagram of components of a system of a vehicle in which an image sensor may be configured to generate image data for use in determining near-infrared glare information, in accordance with some embodiments of the present disclosure.

FIG. 5 shows a block diagram of components of a system of a vehicle in which an image sensor may be configured to generate image data for use in determining near-infrared glare information, in accordance with some embodiments of the present disclosure. Vehicle 500 may correspond to vehicle 200 of FIG. 2. Vehicle 500 may be a car (e.g., a coupe, a sedan, a truck, an SUV, a bus), a motorcycle, an aircraft (e.g., a drone), a watercraft (e.g., a boat), or any other type of vehicle.

Vehicle 500 may comprise processing circuitry 502 which may comprise processor 504 and memory 506. Processor 504 and memory 506 may correspond to processor 112 and memory 114 of FIG. 1, respectively. Processor 504 may comprise a hardware processor, a software processor (e.g., a processor emulated using a virtual machine), or any combination thereof. In some embodiments, processor 504 and memory 506 in combination may be referred to as processing circuitry 502 of vehicle 500. In some embodiments, processor 504 alone may be referred to as processing circuitry 502 of vehicle 500. Memory 506 may comprise hardware elements for non-transitory storage of commands or instructions, that, when executed by processor 504, cause processor 504 to operate vehicle 500 in accordance with embodiments described above and below. Processing circuitry 502 may be communicatively connected to components of vehicle 500 via one or more wires, or via wireless connection.

Image sensor 522 may correspond to image sensor 106 of FIG. 1, and image sensor 522 may be communicatively coupled to processing circuitry 502 (e.g., by way of sensor interface 514). In some embodiments, processing performed by processor 112 of FIG. 1 may be performed at least in part by processor 504. For example, image sensor 522 may transmit to processing circuitry 502 image data detected based on near-infrared light reflected by a surface (e.g., display 306 of FIG. 3), and processing circuitry 502 may evaluate intensity of pixels of the image data to determine whether glare is present at particular regions of the image data (e.g., by comparing determined pixel intensities to a threshold). Based on this evaluation, processing circuitry may adjust a parameter of display 306, e.g., processing circuitry 502 may cause output circuitry 510 to increase brightness of one or more portions of display 306 by a predetermined amount to be higher than a brightness associated with detected glare, and/or processing circuitry 502 may cause output circuitry 510 to increase a contrast ratio at such portion of display 306 (e.g., to increase a contrast between edges of objects depicted at the identified portion of display 306). Such aspects may enable automatic brightness tuning and local color toning and/or color mapping of display 306, to enhance the overall perception and lifespan of automotive infotainment systems and displays. In some embodiments, certain regions of image may not be adjusted (e.g., since such regions may be determined not to be associated with glare, or, even if associated with glare, such regions may be deemed to correspond to components of the vehicle or portions of the display the driver is unlikely to direct his or her vision at). In some embodiments, identifying glare in certain regions of the image data and/or a certain number of regions of the image data and/or a certain percentage of regions of the image data may be used in determining whether glare is present and/or a distribution of glare.

Processor 504 may perform processing (e.g., edge detection, object recognition, computer vision techniques) on the image data received from image sensor 522 to identify which region of the image data depicts display 306, and which portions of display 306 should be adjusted to compensate for glare (and which portions may not need not be adjusted). For example, pixel distance within the image data may be mapped to a location of display 306 based on known dimensions of objects within the image data (e.g., the system may store a length of display 306, a distance from camera 211 to display 306, and use these relationships to correlate pixel distance to real world distance). In some embodiments, multiple cameras 211 at different locations may be employed in a stereo vision process, where each output image data comprising a depiction of display 306 and a projection matrix of each camera 211 in the stereo vision process may be used to map a pixel location in the image data to a location in display 306. In some embodiments, camera 110 may be configured to focus image sensor 106 on components of vehicle likely to be susceptible to glare, e.g., display 306. For example, image data may correspond to a zoomed-in depiction of display 306 and/or display 308, and/or regions of image data other than the objects of interest may be excluded from the image.

Processing circuitry 502 may be communicatively connected to input interface 516 (e.g., a steering wheel, a touch screen on display 306 or display 308, buttons, knobs, a microphone or other audio capture device, etc.) via input circuitry 508. In some embodiments, a driver of vehicle 500 may be permitted to select certain settings in connection with the operation of vehicle 500 (e.g., which displays or portions thereof should be adjusted if glare is detected, inputting certain information, etc.). In some embodiments, processing circuitry 502 may be communicatively connected to GPS system 534 of vehicle 500, where the driver may interact with the GPS system via input interface 516. GPS system 534 may be in communication with multiple satellites to ascertain the driver's location and provide navigation directions to processing circuitry 502.

In some circumstances, sensitivity to glare may vary based on a driver's age. For example, an older driver may be irritated by certain glare characteristics that a younger driver may not be bothered by. Input circuitry 508 may provide an interface for the driver to enter his or her age, or one or more sensors of vehicle 500 may otherwise detect the driver's age, which may allow processing circuitry to more aggressively adjust parameters to counteract glare (e.g., lower the threshold pixel intensity to be compared to pixel intensity of the image data prior to taking corrective action). In some embodiments, input circuitry 508 may receive input from a driver indicating whether a driver is satisfied with the actions being taken to counteract glare, to learn the preferences of the driver, and incorporate this feedback into prospective actions to counteract glare.

Processing circuitry 502 may be communicatively connected to display 512 and speaker 515 by way of output circuitry 510. Display 512 may be located at a dashboard of vehicle 500 (e.g., display 512 may correspond to display 306 and/or display 308 of FIG. 3) and/or a heads-up display at a windshield (e.g., windshield 320 of FIG. 3) of vehicle 500. For example, an interface for GPS system 534 or an interface of an infotainment system may be generated for display, and display 512 may comprise an LCD display, an OLED display, an LED display, or any other type of display. Speaker 515 may be located at any location within the cabin of vehicle 500, e.g., at the dashboard of vehicle 500, on an interior portion of the vehicle door. As discussed above and below, display parameters of display 512 may be adjusted in response to determining NIR glare information associated with one or more portions of display 512.

Processing circuitry 502 may be communicatively connected (e.g., by way of sensor interface 514) to sensors (e.g., front sensor 524, rear sensor 526, left side sensor 528, right side sensor 530, orientation sensor 518, speed sensor 520). Orientation sensor 518 may be an inclinometer, an accelerometer, a tiltmeter, any other pitch sensor, or any combination thereof and may be configured to provide vehicle orientation values (e.g., vehicle's pitch and/or vehicle's roll) to processing circuitry 502. Speed sensor 520 may be one of a speedometer, a GPS sensor, or the like, or any combination thereof, and may be configured to provide a reading of the vehicle's current speed to processing circuitry 502. Front sensor 524, rear sensor 526, left side sensor 528, and/or right side sensor 530 may be positioned at a variety of locations of vehicle 500, and may be one or more of a variety of types, e.g., an image sensor, an ultrasonic sensor, a radar sensor, LED sensor, LIDAR sensor, etc., configured to measure the distance between vehicle 500 and an object in a surrounding environment of the vehicle (e.g., by outputting a light or radio wave signal, and measuring a time for a return signal to be detected and/or an intensity of the returned signal, and/or performing image processing on images captured by the image sensor of the surrounding environment of vehicle 500).

In some embodiments, processing circuitry 502 may synthesize data from multiple sensors in determining how to adjust parameters of display 512. For example, processing circuitry may determine, based on input received from a position sensor (e.g., GPS system 534, front sensor 524, rear sensor 526, left side sensor 528, right side sensor 530, orientation sensor 518, speed sensor 520) that a change in an orientation of vehicle 500 is occurring or is about to occur. For example, processing circuitry 502 may determine based on sensor data received from orientation sensor 518 (or GPS data from GPS system 534 or speed data from speed sensor 520) that vehicle 500 is turning or is navigating a bend, or based on sensor data received from front sensor 524 that vehicle 500 is about to navigate a bend or turn. For example, the anticipated turn may be determined based on GPS system 534 indicating an upcoming bend in a current navigation route. Processing circuitry 502 may generate a prediction, based on the NIR glare information received from image sensor 522 and the sensor data from the position sensor (e.g., orientation sensor 518, front sensor 524, rear sensor 526, etc.) of a location on display 306 where glare is likely to be present in response to the change in the orientation of vehicle 500. For example, processing circuitry 502 may determine that glare is currently associated with a particular portion of display 306, and identify another portion of display 306 that such glare is likely to shift based on the actual or anticipated change in orientation of vehicle 500.

In some embodiments, a position of the sun based on a particular location and/or time of day and/or orientation data may be determined by processing circuitry 502. For example, such information may be stored at one or more of memory 506, user device 538, and/or remote server 240. Processing circuitry 502 may continuously determine the exact position of the sun by comparing sensor data and a current time to such stored information, and determine whether glare if present and a distribution of glare based on the determined position of the sun relative to vehicle 500. In some embodiments, processing circuitry 502 may receive or otherwise determine current weather information, and such weather information may be utilized to predict an amplitude of the sun, which may be taken into account in determining whether glare is present. Additionally or alternatively, certain traits of vehicle 500, e.g., a size and position of windshield 320, roof, windows, sunroof, etc. may be known and stored for use in predicting a reflection glare location. For example, processing circuitry 502 may calculate the sun's exact position relative to vehicle 500 based on location data and time/date, and based on the determined location of sunroof of vehicle 500, processing circuitry 502 may predict that when vehicle 500 is at a certain position and a particular roll/pitch/yaw (e.g., determined based on data from orientation sensor 518), the sun will be shining through the sunroof and onto display 306 and/or 308. In some embodiments, glare may be determined based on the position and heading of vehicle 500, in combination with tracking the glare shift (or without separately tracking the glare shift).

In some embodiments, processing circuitry 502 may be in communication (e.g., via communications circuitry 536) with user device 538 (e.g., a mobile device, a computer, a key fob, etc.). Such connection may be wired or wireless. In some embodiments, user device 538 may enable a driver to view, and/or configure settings associated with, near-infrared glare information associated with vehicle 500. In some embodiments, communications circuitry 536 and/or user device 538 may be in communication with one or more servers 540 (e.g., over a communications network such as, for example, the Internet, WAN, LAN, satellite network, cellular network, etc.), which may be configured to provide information related to determining whether glare is present, and provide updated displays based on determined glare information.

Processing circuitry 502 may be communicatively connected to battery system 532, which may be configured to provide power to one or more of the components of vehicle 500 during operation. In some embodiments, vehicle 500 may be an electric vehicle or a hybrid electric vehicle.

It should be appreciated that FIG. 5 only shows some of the components of vehicle 500, and it will be understood that vehicle 500 also includes other elements commonly found in vehicles (e.g., electric vehicles), e.g., a motor, brakes, wheels, wheel controls, turn signals, windows, doors, etc.

Figure 6:
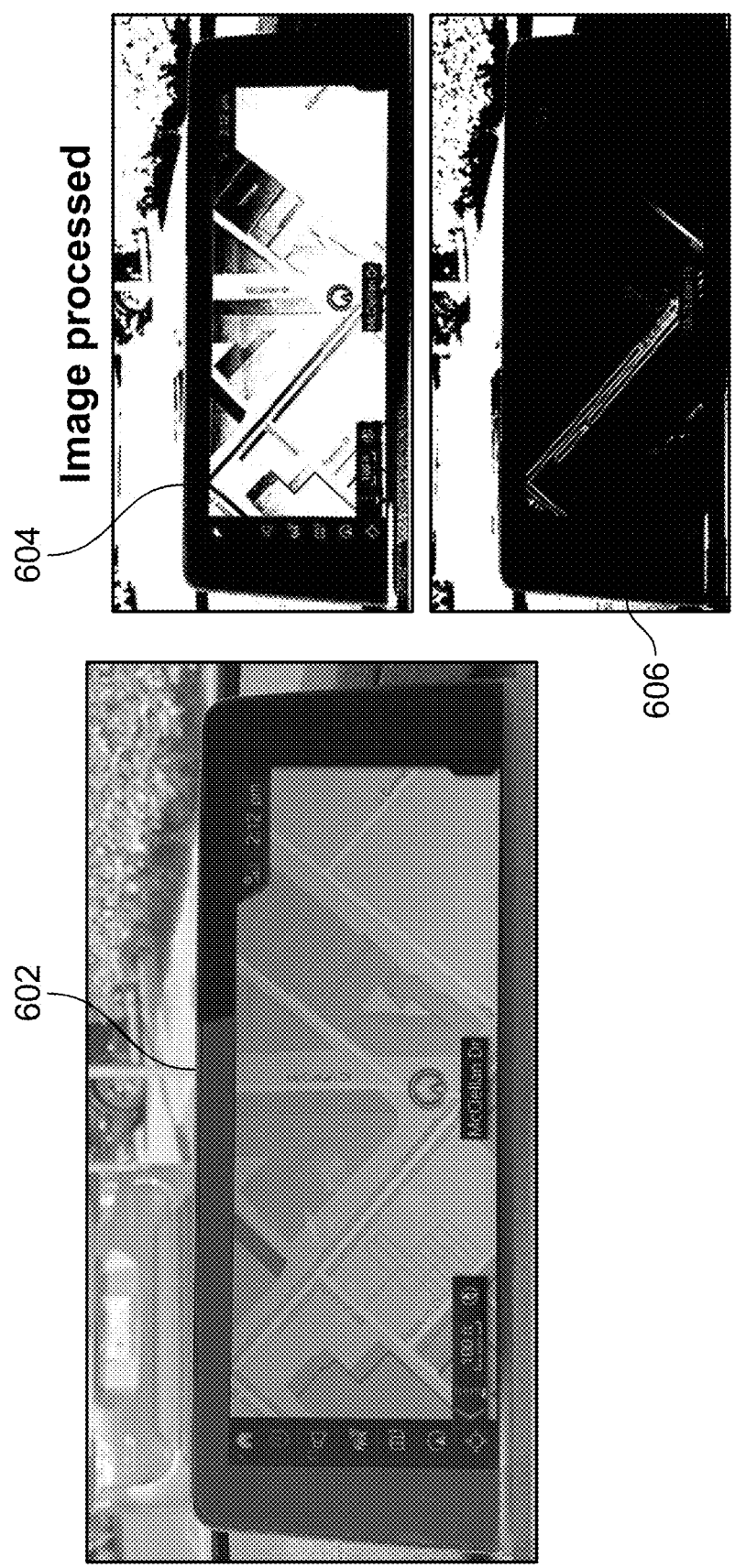
FIG. 6 shows an image of a vehicle dashboard captured by a camera which does not include a longpass near-infrared filter that is employed in some embodiments of the present disclosure.

FIG. 6 shows an image 602 of a vehicle dashboard (e.g., comprising display 306 of FIG. 3) captured by a camera that does not include longpass near-infrared filter 104 that is employed in some embodiments of the present disclosure. In image 602 captured by such camera that does not employ longpass near-infrared filter 104, it may be difficult to detect (and for an observer to discern) glare caused by reflected light due to the spectral overlap between the solar irradiance spectrum and the visible light (RGB colors) from the display. Even if processing is performed on image 602 (e.g., when image 602 is a color image, to convert image 602 to a black and white image, or a grayscale image, based on intensity values of image 602, as shown in processed images 604 and 606), it remains difficult to determine whether glare is present, due to a low signal-to-noise-ratio (the sunlight being the signal) of processed images 604, 606. For example, depending on darkness settings associated with the processing, the processed image either (erroneously) appears not to have any glare as shown in image 606, or is too dark to convey any meaningful information as shown in image 606, and thus it is difficult to determine if glare is present in any region of image 602.

Figure 7:
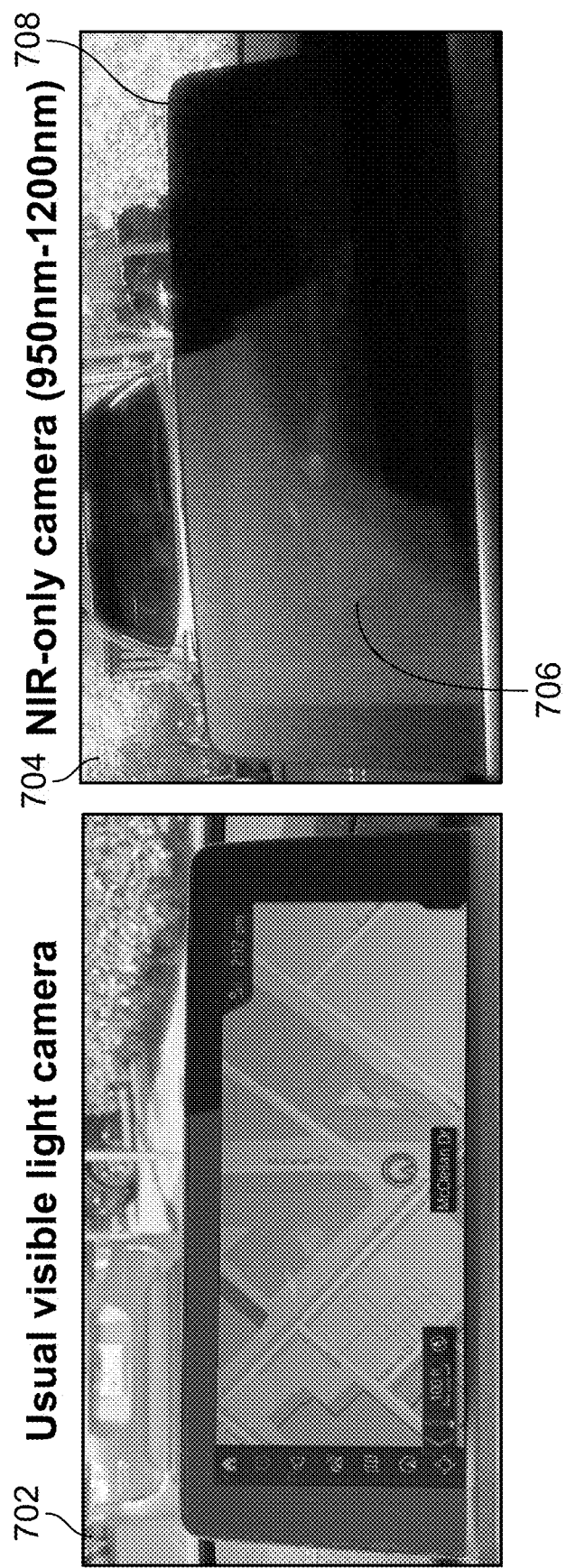
FIG. 7 shows an image of a vehicle dashboard captured by a camera comprising a longpass near-infrared filter, in accordance with some embodiments of the present disclosure.

FIG. 7 shows an image 704 of a vehicle dashboard (e.g., comprising display 306 of FIG. 3) captured by camera 110 comprising longpass near-infrared filter 104, in accordance with some embodiments of the present disclosure. As can be seen in the side-by-side comparison of image 702 and image 704 of FIG. 7, camera 110 comprising longpass near-infrared filter 104 captures image 704 and enables image 704 have a far superior signal-to-noise ratio for detecting glare information as compared to image 702 (which corresponds to image 602 of FIG. 6). For example, generally brighter regions of image 704 (e.g., having pixels with relatively higher intensities), such as region 706 of image 704, may correspond to regions of image 704 that are subjected to glare, whereas generally darker regions of image 704 (e.g., having pixels with relatively lower intensities), such as region 708 of image 704, may correspond to regions of image 704 that are not associated with glare. Thus, image 704 may be analyzed by processor 112 of camera 110 and/or processor 504 of FIG. 5 to determine near-infrared glare information, and in addition such information may be readily ascertained visually by an observer of image 704. In the example of FIG. 7, a longpass near-infrared filter at 950 nm is utilized, as well as a silicon-based CCD or CMOS, and thus a detected near-infrared portion of light reflected by display 306 comprises light in the 950-1200 nm range. However, it should be appreciated that a longpass near-infrared filter at any suitable wavelength may be utilized to facilitate the detection of light in the near-infrared range, and that a germanium-based CCD or CMOS may be utilized, e.g., capable of detecting wavelengths of 900-2600 nm.

Figure 8:
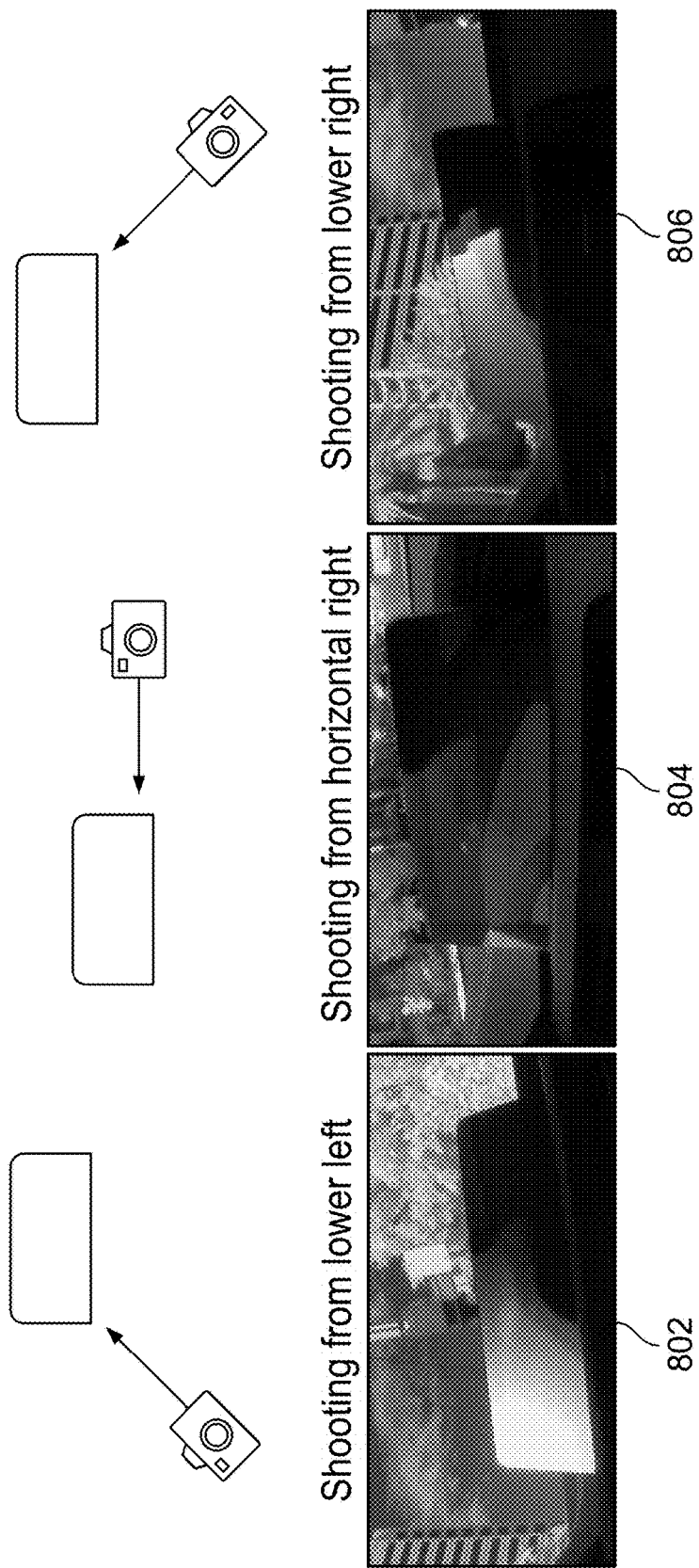
FIG. 8 shows images of a vehicle dashboard captured by a camera from various angles, where the camera comprises a longpass near-infrared filter, in accordance with some embodiments of the present disclosure.

FIG. 8 shows images 802, 804, 806 of a vehicle dashboard (e.g., comprising display 306 of FIG. 3) captured by camera 110 comprising longpass near-infrared filter 104 from various angles, in accordance with some embodiments of the present disclosure. For example, image 802 is captured from a lower left perspective (e.g., 45 degree angle) relative to display 306, image 804 is captured along a same plane as display 306 and from a right hand side of display 306, and image 806 is captured from a lower right perspective (e.g., a 45 degree angle) relative to display 306. It should be appreciated that any number of images of display 306, from any combination of perspectives, may be captured by camera 110. In the example of FIG. 7, a longpass near-infrared filter at 950 nm is utilized, as well as a silicon-based CCD or CMOS, and thus a detected near-infrared portion of light reflected by display 306 comprises light in the 950-1200 nm range. However, it should be appreciated that a longpass near-infrared filter at any suitable wavelength may be utilized to facilitate the detection of light in the near-infrared range, and that a germanium-based CCD or CMOS may be utilized, e.g., capable of detecting wavelengths of 900-2600 nm. Processor 112 may transmit image data associated with captured images 802, 804, 806 to processing circuitry 502, and processing circuitry may determine aggregated near-infrared glare information based on the combined images 802, 804, 806 and cause output circuitry adjust one or more parameters of display 306 based on the aggregated near-infrared glare information.

Figure 9:
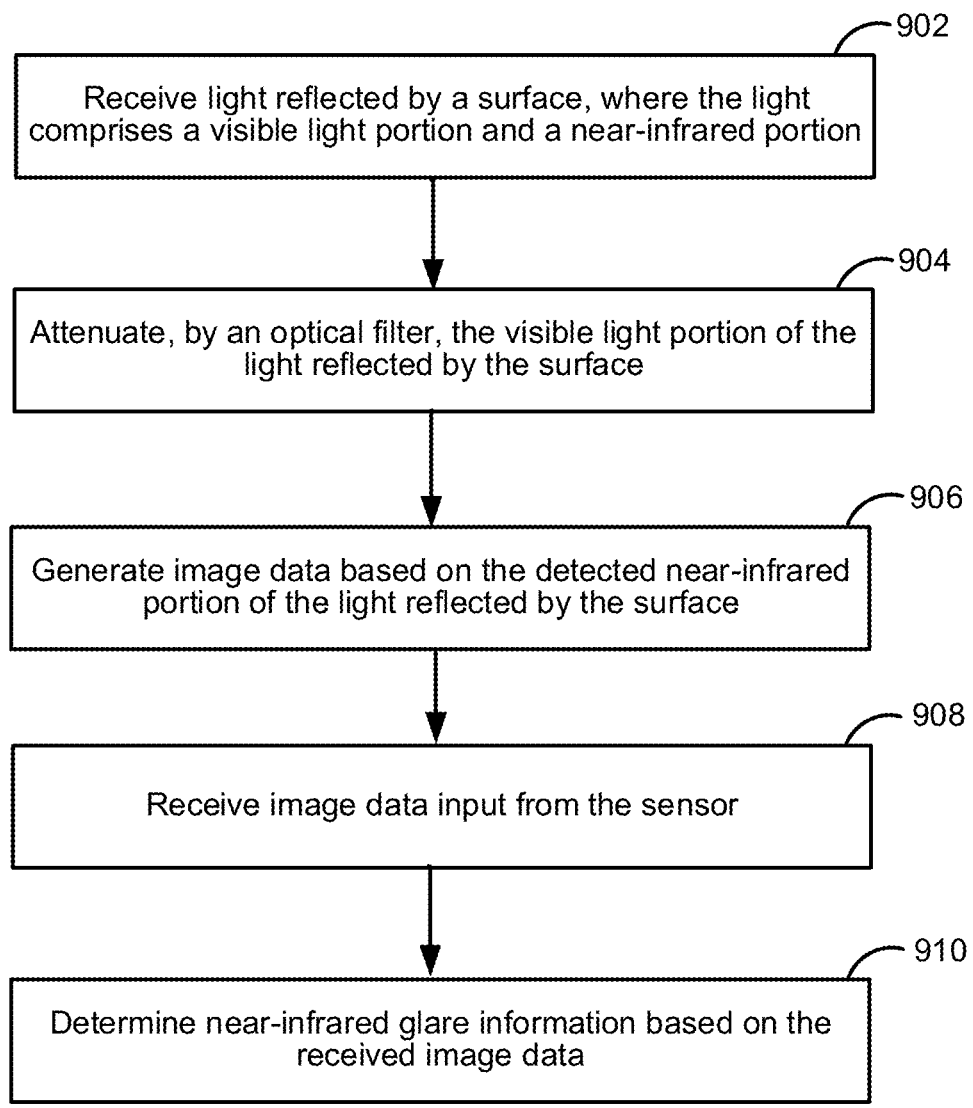
FIG. 9 shows a flowchart of an illustrative process for determining near-infrared glare information, in accordance with some embodiments of the present disclosure.

FIG. 9 is an illustrative flowchart of a process 900 for determining near-infrared glare information, in accordance with some embodiments of the disclosure. Process 900 may be executed by processing circuitry (e.g., processor 112 of FIG. 1 and/or processing circuitry 502 of FIG. 5). Process 900 may be utilized in a design phase (e.g., as discussed in connection with FIG. 4A-4B) and/or for in-vehicle glare compensation (e.g., as discussed in connection with FIGS. 2-3).

At 902, light 101 that enters camera 110 through lens 102 after reflecting off a surface (e.g., display 306 of FIG. 3, surface 404 of FIG. 4) is received. Light 101 comprises a visible light portion and a near-infrared (NIR) light portion.

At 904, the visible light portion of light 101 reflected by the surface is attenuated. For example, longpass optical filter 104 may be used to highly attenuate the visible light portion and pass NIR light 105 with low attenuation. The NIR light having passed through optical filter 104 may be detected by image sensor 106.

At 906, image data may be generated by image sensor 106 based on the detected NIR portion of light 101 reflected by the surface, e.g., surface 306 or 404. In some embodiments, image sensor 106 may be a CCD or CMOS sensor of camera 110. Such image data may be used in determining whether glare is present. In some embodiments, a distribution of glare may be determined based on the image data.

At 908, the image data from image sensor 106 is received by a processor (e.g., processor 112 of FIG. 1 and/or processor 504 of FIG. 5). For example, processor 112 may receive the image data and transmit the image data via I/O circuitry 116 to processor 504, for further processing, or processor 112 may perform such processing.

Figure 12:
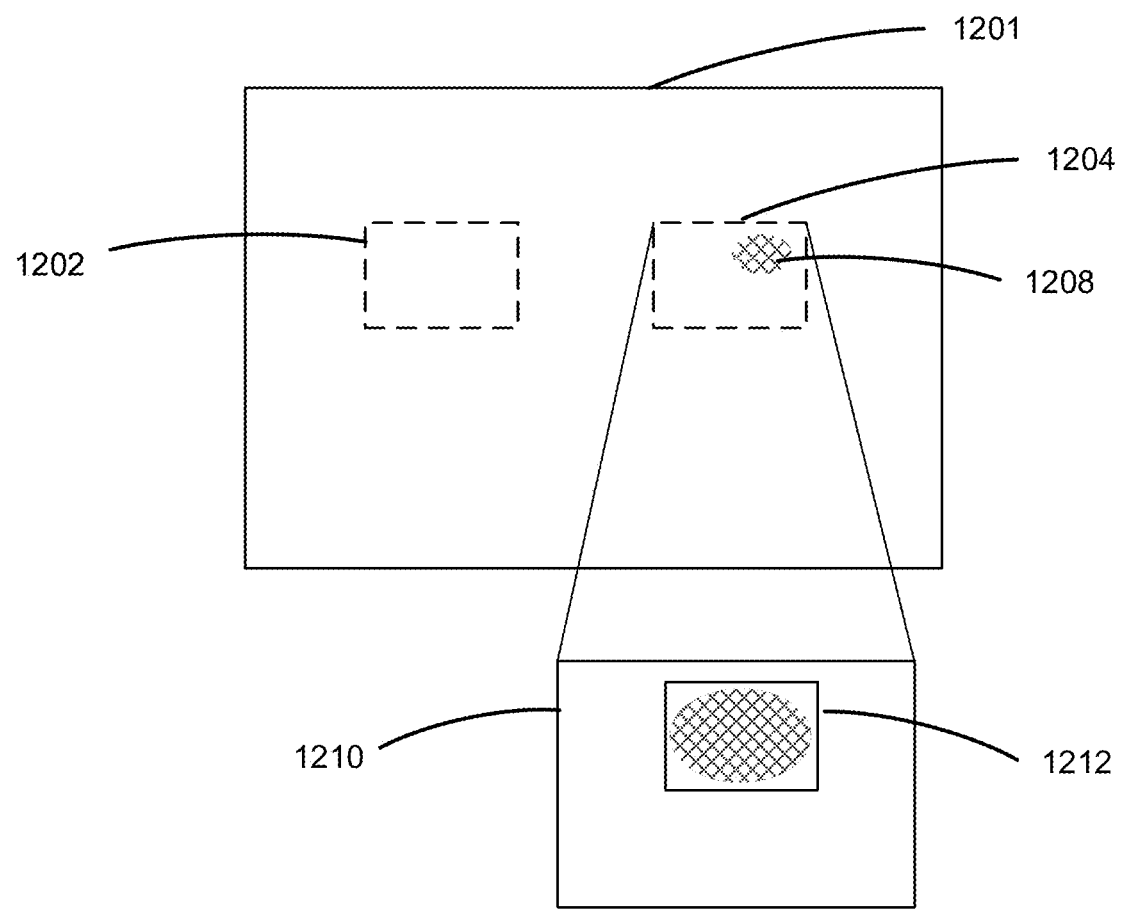
FIG. 12 shows an exemplary technique of using image data to determine near-infrared glare information, in accordance with some embodiments of the present disclosure.

In an illustrative example, the received image data may correspond to image 1201 of FIG. 12. FIG. 12 shows an exemplary technique of using image data to determine near-infrared glare information, in accordance with some embodiments of the present disclosure. For example, processor 112 and/or processor 504 may determine, based on image data 1201, location 1212 of display 1210 at which glare is present. Image 1201 may comprise regions 1202 and 1204 respectively corresponding to images of display 308 and 306 of vehicle 200, and image 1201 may have been captured by camera 211 of FIG. 2, e.g., disposed at a location that is in a vicinity of a head rest location of operator seat 202 of vehicle 200.

At 910, processor 112 and/or processor 504 may determine NIR glare information based on the received image data. For example, the image data corresponding to image 1201 may comprise a plurality of pixels, and processor 112 and/or processor 504 may analyze respective intensity values of such pixels to determine NIR information. In some embodiments, processor 112 and/or processor 504 may determine that a particular region 1204 of the image data is associated with glare 1208 if a predefined amount of pixels in region 1206 are associated with an intensity value above a predetermined threshold. On the other hand, region 1202 (e.g., corresponding to display 308) of image 1201 may be determined not to be associated with glare if less than a predefined amount of pixels in region 1202 are associated with an intensity value above the predetermined threshold. In some embodiments, processor 112 and/or processor 504 may identify multiple regions of the image data that are associated with glare, and may determine certain patterns or distribution of glare within the image data. In some embodiments, multiple images may be captured by camera 110, and the NIR information may be determined based on an analysis of the multiple images in combination.

Image processing (e.g., edge detection, object recognition, computer vision techniques) may be performed on image 1201 to map regions of the image data of image 1201 to portions of display 1210 (e.g. of vehicle 200), to determine which portions of display 1210 should be adjusted to compensate for glare (and which portions may not need to be adjusted). For example, pixel distance within the image data may be mapped to a location 1212 of display 1210 based on known dimensions of objects within the image data (e.g., the system may store a length of display 1210, a distance from camera 211 to display 1210, and use these relationships to correlate pixel distance to real world distance). After such mapping of the glare in the image data to display 1210, one or more parameters of display 1210 may be adjusted to counteract the detected glare.

Figure 10:
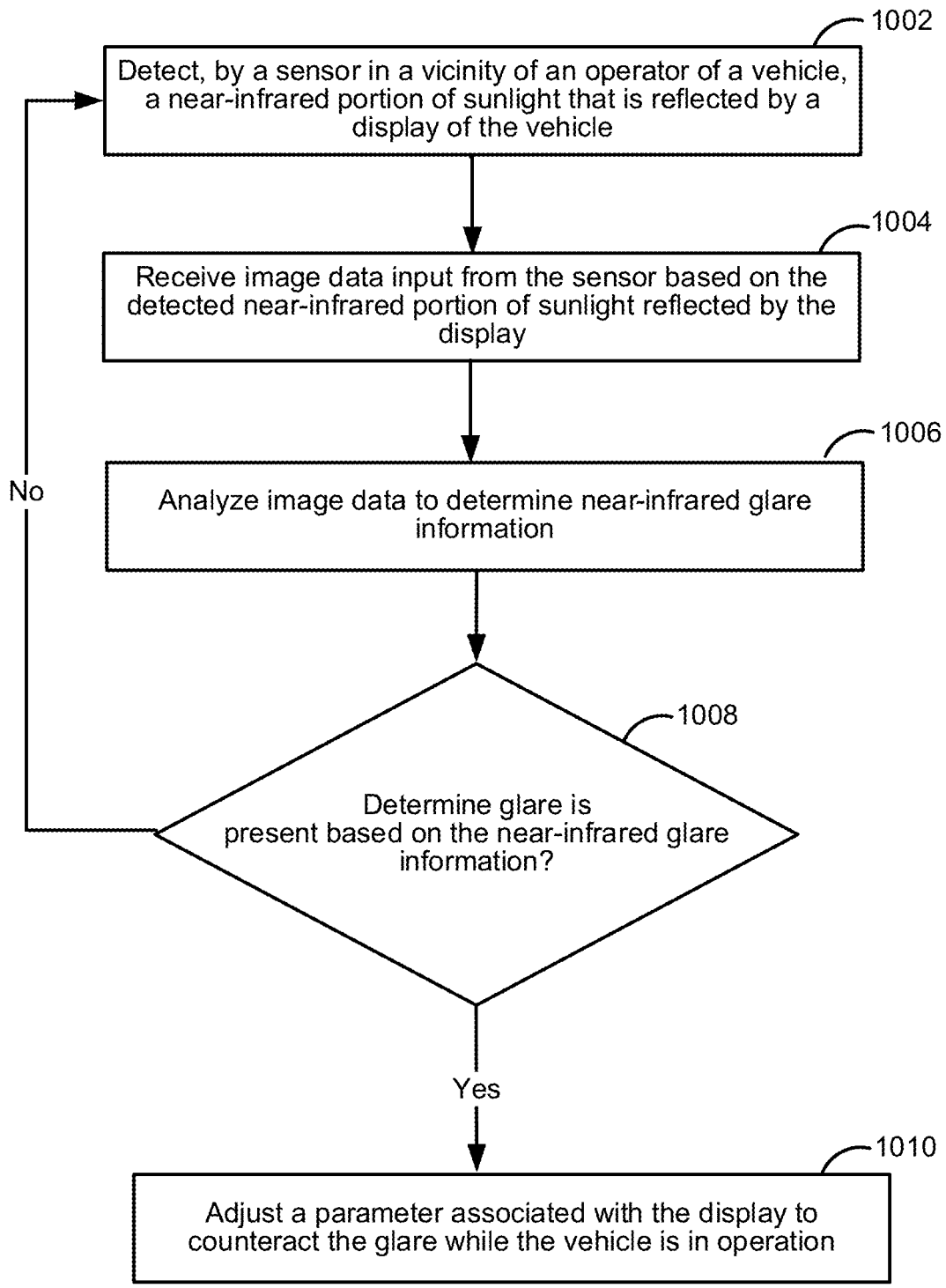
FIG. 10 shows a flowchart of illustrative process for adjusting a parameter associated with a display of a vehicle to counteract glare, in accordance with some embodiments of the present disclosure.

FIG. 10 shows a flowchart of illustrative process 1000 for adjusting a parameter associated with a display of a vehicle to counteract glare, in accordance with some embodiments of the present disclosure. Process 1000 may be executed by processing circuitry (e.g., processor 112 of FIG. 1 of camera 110 and/or processing circuitry 502 of vehicle 200) of camera 110 and/or vehicle 200.

At 1002, image sensor 106 of FIG. 1, which may correspond to image sensor 522 of FIG. 5 positioned in vehicle 500 near operator 204 of FIG. 2, may detect an NIR portion of light that is reflected 214, 216, 218 by an interior 300 of vehicle 200 of FIG. 2. In some embodiments, image sensor 106 of camera 211 may be disposed at a location that is in a vicinity of a head rest location of operator seat 202 of vehicle 200, e.g., on a shoulder of driver seat 202, and/or a ceiling of vehicle 200. The NIR portion of light may be detected after having passed through longpass optical filter 104, and may have been reflected off one or more surfaces of vehicle 200, e.g., steering wheel 304, display 306, display 308, windshield 320, side view mirror 322, etc.

At 1004, processor 112 of FIG. 1 and/or processor 504 of FIG. 5 may receive the image data generated by image sensor 106, comprising the detected near-infrared portion of light reflected by the interior 300 of vehicle 200, from image sensor 106. For example, processor 112 may receive the image data and transmit the image data via I/O circuitry 116 to processor 504, for further processing, or processor 112 may perform such processing.

Figure 13:
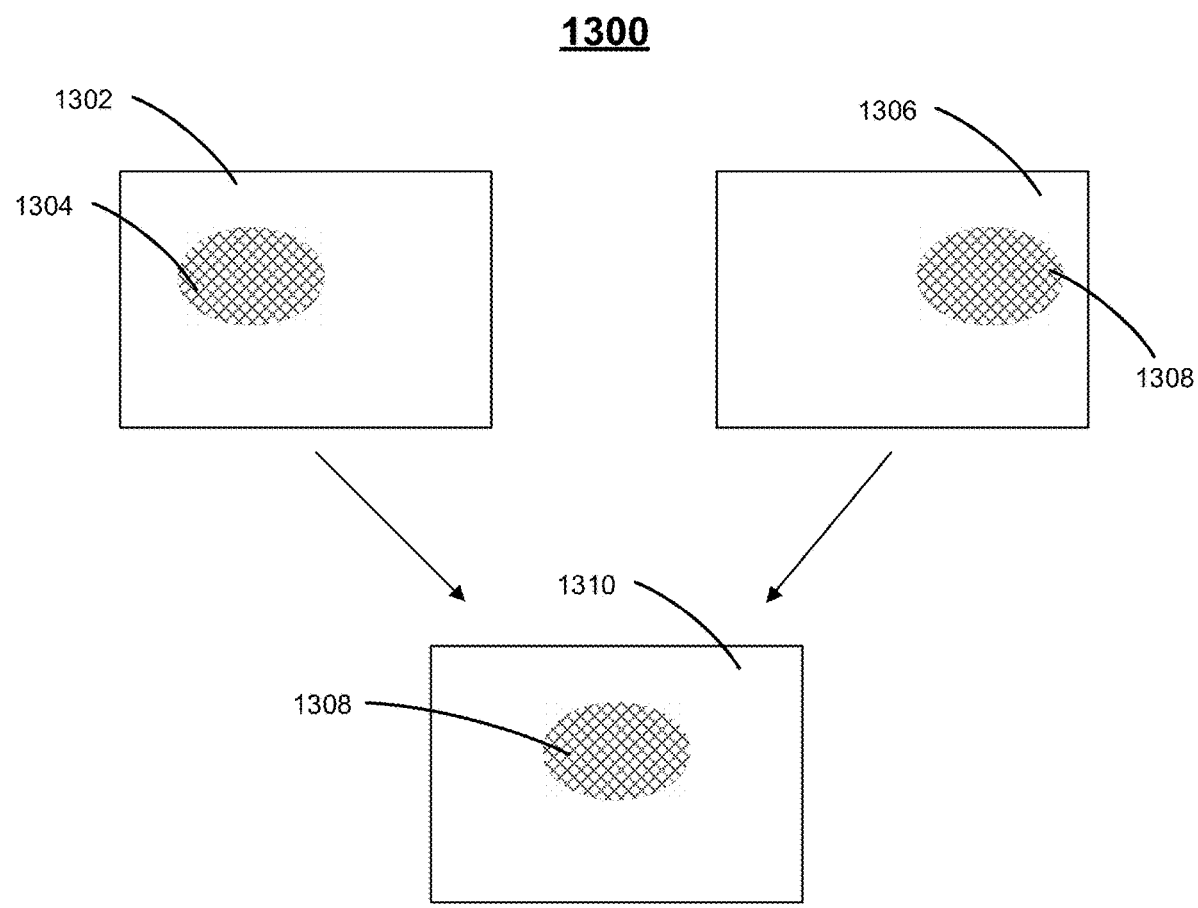
FIG. 13 shows an exemplary technique of determining near-infrared glare information based on multiple images, in accordance with some embodiments of the present disclosure.

In some embodiments, vehicle 200 may include multiple image sensors 106 offset from driver 204 of vehicle 200 to capture image data within a predefined period of time. For example, an image sensor may not be positioned directly in front of driver 204, but rather one image sensor may be located at a shoulder of a head rest of driver seat 202 (and/or a passenger seat), and another image sensor may be located at a ceiling of vehicle 200. For example, referring additionally to FIG. 13, a first image sensor may capture image 1302 of FIG. 13, and another image sensor may capture image

1306. Image data from image 1302 may comprise region 1304 which is associated with glare, and image 1306 may comprise region 1308 which is associated with glare.

At 1006, processor 112 of FIG. 1 and/or processor 504 of FIG. 5 may analyze the received image data. 1006 may be performed in a similar manner as 908 of FIG. 9. In some embodiments, processor 112 of FIG. 1 and/or processor 504 may interpolate image 1310 of FIG. 13 comprising region 1308 associated with glare, based on input images 1304 and 1306, to estimate how regions 1304 and 1308 appear to driver 204 (e.g., in the vehicle display). In some embodiments, any suitable adaptive or non-adaptive image interpolation algorithm may be employed to estimate pixel locations for image 1310. In some embodiments, image data of a single image may be analyzed rather than multiple images.

At 1008, processor 112 of FIG. 1 and/or processor 504 of FIG. 5 determines, based on the image analysis performed at 1006, whether glare is present on display 306 or 308 of vehicle 200 based on the near-infrared glare information. Processing proceeds to 1010 upon determining that glare is present in the analyzed image data. Upon determining that glare is not present in the analyzed image data, processing may proceed to 1002.

At 1010, processor 504 of FIG. 5 may adjust a parameter associated with display 306 to counteract the glare while vehicle 200 of FIG. 2 is in operation. For example, processor 504 may cause output circuitry 510 of FIG. 5 to increase a brightness level of a portion of display 306 that corresponds to a region of pixels that are determined to be associated with glare. The brightness may be increased to a level that exceeds an intensity value of the region of pixels associated with glare, to enable operator 204 to perceive information presented on display 306 even in the presence of glare. In some embodiments, a contrast ratio of display 306 may be adjusted (e.g., increased) to counteract glare, or output circuitry 510 may perform color mapping (e.g., in a situation with extreme glare, a display of various colors may be adjusted to a black and white display to enable operator 204 to perceive information presented on display 306). Region 1308, associated with glare of image 1310, may be mapped to a location at display 306, in accordance with the techniques discussed in connection with FIG. 12.

In some embodiments, the NIR information may be synthesized with sensor data from a position sensor (e.g., orientation sensor 518) to determine that a change in orientation of vehicle 200 may be occurring or may be about to occur, and may predict a portion of display 306 that glare is likely to be associated with when the orientation change occurs. Processing circuitry 502 may adjust parameters of display 306 in accordance with the prediction, to enhance the user experience by correcting portions of display 306 in anticipation of expected glare.

Figure 11:
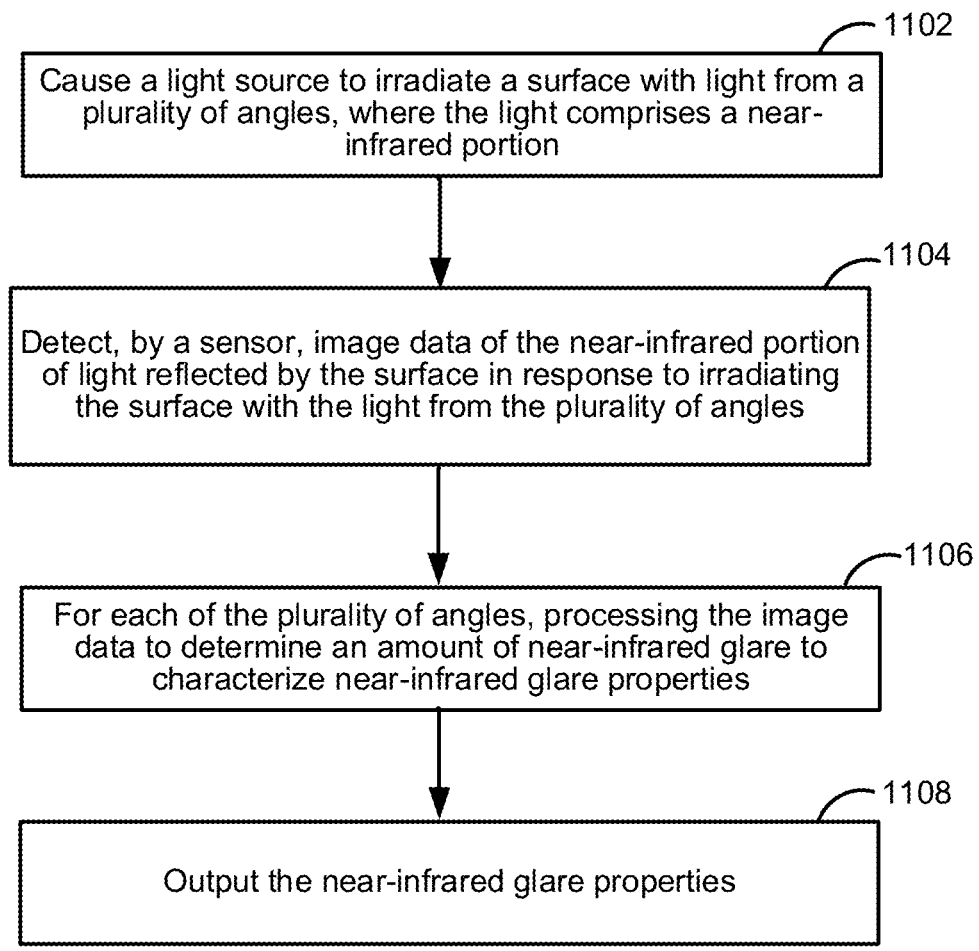
FIG. 11 shows a flowchart of illustrative process for outputting near-infrared glare properties, in accordance with some embodiments of the present disclosure.

FIG. 11 shows a flowchart of illustrative process for outputting near-infrared glare properties, in accordance with some embodiments of the present disclosure. Process 1100 may be executed by processing circuitry (e.g., processor 112 of FIG. 1 and/or processing circuitry 502 of FIG. 5).

At 1102, light source 402 may be caused (e.g., by an operator, or by way of processing circuitry coupled to light source 402) to irradiate a surface 404 with light from a plurality of angles, where the light comprises a near-infrared portion having passed through longpass filter 104 of FIG. 1. In some embodiments, light source 402 may be any source of light configured to emit NIR light, e.g., sunlight, incandescent lights, certain LEDs, lasers, laser diodes. In some embodiments, light source 402 may be placed on platform 408, which may be elevated and/or rotated to irradiate surface 404 from the plurality of angles.

At 1104, image sensor 106 may detect image data based on the near-infrared portion of light reflected by surface 404 (e.g., light 412, 416) in response to irradiating surface 404 with light (e.g., 410, 414) from the plurality of angles. The light detected by image sensor 106 may have passed through longpass optical filter 104 of FIG. 1, configured to attenuate a visible light portion of the light.

At 1106, for each of the plurality of angles, a processor (e.g., processor 112 of FIG. 1 which may be included in camera 406 of FIG. 4 and/or a processor of computer 434) may process the image data received from image sensor 106 to determine an amount of near-infrared glare, in order to characterize near-infrared glare properties of surface 404. For example, the image data may comprise a plurality of pixels, and an intensity of the pixels may be identified at each of a plurality of angles that light source 402 irradiates light towards surface 404. Thus, an optimal material and/or orientation of the material of surface 404 may be determined to minimize the impact of glare on surface 404. For example, a range of suitable materials can be tested as candidate components for a system (e.g., a steering wheel of a vehicle, a windshield of a vehicle), and that the material having the least amount of glare (e.g., lowest maximum intensity level of pixels) can be selected. In some embodiments, such near-infrared properties may be represented as a percentage of light that is reflected and/or distribution and/or scattering properties of the reflected light.

Figure 14:
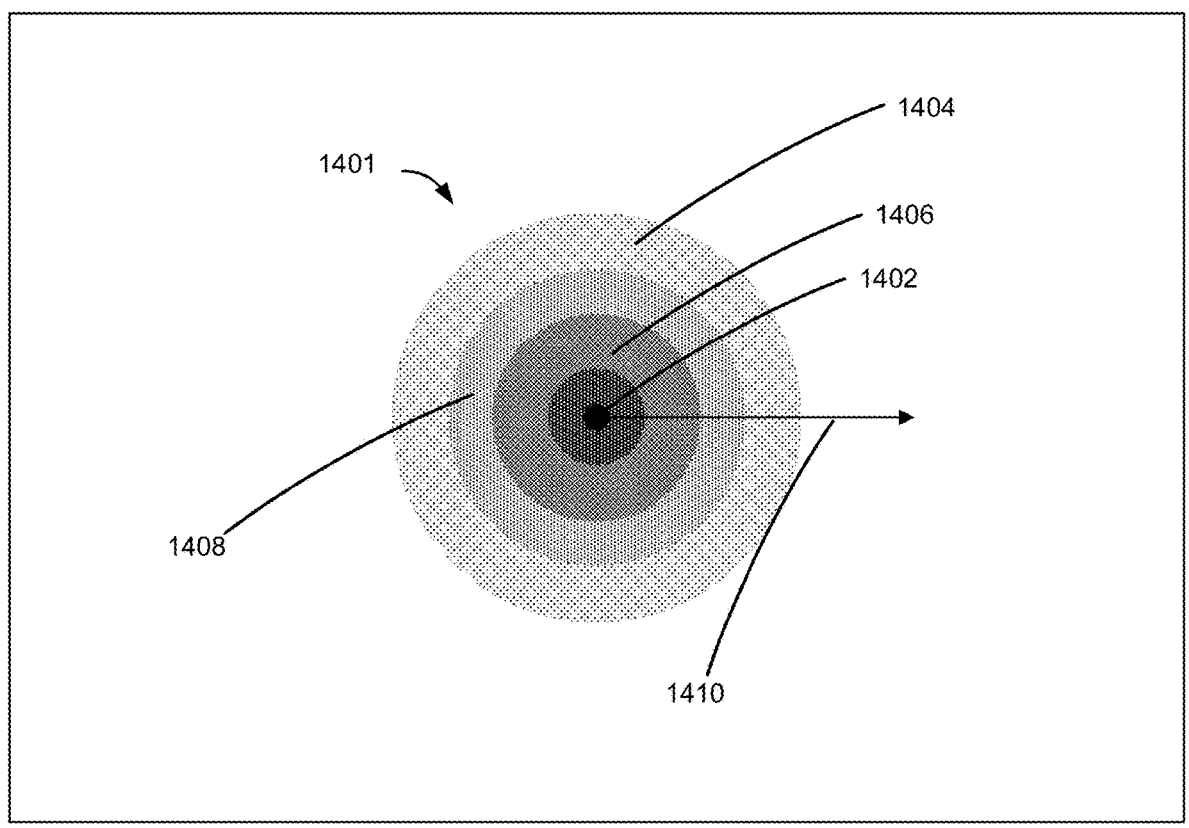
FIG. 14 shows an exemplary image representing near-infrared glare properties of a surface, in accordance with some embodiments of the present disclosure.

At 1108, the determined near-infrared glare properties may be output (e.g., at computing device 434) in any suitable format. For example, the near-infrared glare properties may be output as an intensity curve, as shown in FIG. 14, as a function of radial distance from the center of the depicted glare. FIG. 14 shows an exemplary image representing near-infrared glare properties of a surface, in accordance with some embodiments of the present disclosure. For example, darker portions 1402 at a center of circle 1401 of output image 1400 may represent higher intensity pixel values, whereas lighter portions 1404 may represent, at a perimeter of circle 1401 depicted in image 1400, lower intensity pixel values. For example, darker portions 1402 may correspond to pixels that are associated with glare. In some embodiments, lighter portions of image 1400 may represent portions associated with glare, whereas darker portions of image 1400 may represent portions determined not to be associated with glare. The pixel intensity values may decrease from a center of circle 1401 depicted in image 1400 to an outer portion of the circle of image 1400. For example, arrows 1410 may illustrate a gradient from the intense pixel values to the least intense pixel values. In some embodiments, pixel intensity values may be compared to a predetermined intensity threshold value. For example, darker portion 1402 may be determined to correspond to a pixel intensity value meeting or exceeding the predetermined intensity threshold value. In some embodiments, depending on the predetermined intensity threshold value, pixels of lesser intensity values (e.g., pixels at one or more of portion 1406 and/or portion 1408) may also be determined to correspond to pixels associated with glare, in determining whether glare is present.

For example, if a relatively small size light source 402 is used and surface 404 scatters only a small amount of reflected light 412, 416, then processing circuitry of one or more of camera 110, computing device 434, vehicle 500 may determine that a relatively small number of pixels in a particular region are associated with glare. On the other hand, such processing circuitry may determine, e.g., when surface 404 scatters a significant amount of light and/or light source 402 is larger, that a relatively large number of pixels are associated with glare. As scattering increases, the amount of affected pixels increases, and the processing circuitry may generate for output an intensity curve (e.g., as illustrated in FIG. 14) as a function of radial distance from the center of circle 1401. In some embodiments, processing circuitry of one or more of camera 110, computing device 434, vehicle 500 may determine a size of a region impacted by glare. For example, if it is determined that region 1402 is below a threshold size, it may be determined that corrective action is not needed, even if glare is present, and/or that a particular material exhibiting such glare properties may still be suitable in terms of near-infrared glare properties. On other hand, if a size of a particular region is determined to be above a threshold size, it may be determined that corrective action is needed, and/or that the material exhibiting such properties is not suitable in terms of near-infrared glare properties. It should be appreciated that circle 1401 is an illustrative shape, and any suitable shape or representation may be utilized to convey glare information in the example of FIG. 14.

The foregoing is merely illustrative of the principles of this disclosure, and various modifications may be made by those skilled in the art without departing from the scope of this disclosure. The above-described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

What is claimed is:

1. A method for counteracting glare in a vehicle, the method comprising:
   receiving image data, comprising a portion of light reflected by an interior surface of a vehicle, from an image sensor in the vehicle;
   determining glare information based on the received image data;
   determining whether glare is present on a display of the vehicle based on the glare information; and
   in response to determining that glare is present, adjusting a parameter associated with the display to counteract the glare.

2. The method of claim 1, wherein the portion of light is a near-infrared portion of light, and the glare information is near-infrared glare information.

3. The method of claim 1, wherein the parameter comprises at least one of a contrast ratio or brightness.

4. The method of claim 1, further comprising;
   determining, based on input received from one or more position sensors, that a change in an orientation of the vehicle is occurring or is about to occur; and
   generating, based on the determined change in the orientation and based on the glare information, a prediction of a location on the display where glare is likely to be present in response to the change in the orientation of the vehicle,
   wherein the adjusting of the parameter is performed based on the prediction.

5. The method of claim 1, wherein the image sensor is disposed at a location that is in a vicinity of a head rest location of an operator seat of the vehicle.

6. The method of claim 1, wherein the display is located at a dashboard of the vehicle or at a heads-up display at a windshield of the vehicle.

7. The method of claim 1, wherein:
   the image data comprises a plurality of pixels;
   determining whether glare is present on the display of the vehicle based on the glare information comprises determining glare is present at a region of image data that corresponds to the display; and
   adjusting the parameter associated with the display to counteract the glare comprises adjusting a parameter in a portion of the display that corresponds to the region of the image data where glare is present and not adjusting the parameter in a different portion of the display.

8. The method of claim 7, wherein:
   determining glare is present at the region of image data that corresponds to the display comprises:
      determining, for each pixel of the plurality of pixels, respective intensity values; and
      identifying multiple pixels of the plurality of pixels having an intensity value that exceeds a predetermined threshold intensity value.

9. The method of claim 8, wherein:
   determining glare is present at the region of image data that corresponds to the display further comprises determining glare is present at multiple regions of the image data, wherein each of the multiple regions comprises a separate grouping of a subset of the identified multiple pixels, at least one of the regions corresponding to the display and at least one of the regions corresponding to an additional display; and
   adjusting the parameter associated with the display to counteract the glare further comprises adjusting a parameter in a portion of the additional display that corresponds to the region of the image data where glare is present and not adjusting the parameter in a different portion of the additional display.

* * * * *